(12) United States Patent
Kim

(10) Patent No.: US 8,044,583 B2
(45) Date of Patent: Oct. 25, 2011

(54) ORGANIC ELECTROLUMINESCENT DEVICE WITHOUT CAP AND GETTER

(75) Inventor: Woo Chan Kim, Kyongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 319 days.

(21) Appl. No.: 11/168,369

(22) Filed: Jun. 29, 2005

(65) Prior Publication Data

US 2006/0022593 A1   Feb. 2, 2006

(30) Foreign Application Priority Data

Jul. 27, 2004  (KR) .................. 10-2004-0058676

(51) Int. Cl.
*H05B 33/00* (2006.01)
*H05B 39/00* (2006.01)

(52) U.S. Cl. ........ 313/512; 313/507; 313/508; 313/511; 445/24; 445/25

(58) Field of Classification Search .......... 313/582, 313/501–512
See application file for complete search history.

(56) References Cited

U.S. PATENT DOCUMENTS

| | | | |
|---|---|---|---|
| 6,107,735 A * | 8/2000 | Hora | 313/506 |
| 6,492,011 B1 * | 12/2002 | Brandle et al. | 428/217 |
| 6,522,067 B1 * | 2/2003 | Graff et al. | 313/512 |
| 6,570,325 B2 * | 5/2003 | Graff et al. | 313/506 |
| 6,573,652 B1 * | 6/2003 | Graff et al. | 313/512 |
| 6,597,111 B2 * | 7/2003 | Silvernail et al. | 313/506 |
| 6,862,008 B2 | 3/2005 | Yamazaki et al. | |
| 2002/0125822 A1 * | 9/2002 | Graff et al. | 313/506 |
| 2002/0181109 A1 * | 12/2002 | Chu | 359/586 |
| 2003/0030381 A1 | 2/2003 | Yamazaki et al. | |
| 2003/0048074 A1 | 3/2003 | Ni et al. | |
| 2003/0064171 A1 | 4/2003 | Burrows et al. | |
| 2003/0085654 A1 * | 5/2003 | Hayashi | 313/506 |
| 2003/0094016 A1 * | 5/2003 | Duffy et al. | 65/60.2 |

(Continued)

FOREIGN PATENT DOCUMENTS

CN       1407373 A     4/2003

(Continued)

OTHER PUBLICATIONS

H. Lifka, H.A. van Esch et al., "Thin Film Encapsulation of OLED Displays with a NONON Stack", Sid 04 Digest, pp. 1384-1387, 2004.

(Continued)

*Primary Examiner* — Anne Hines
*Assistant Examiner* — Tracie Y Green
(74) *Attorney, Agent, or Firm* — Birch, Stewart, Kolasch & Birch, LLP

(57) ABSTRACT

An organic electroluminescent device is provided. The structural components of the organic electroluminescent device can be excluded from external conditions without using a cap and whose thickness can be remarkably reduced without installing a getter. The organic electroluminescent device as embodied has the structure that a protective layer with a multi-layered structure is formed on the entire structure of the structural components to exclude the structural components completely from external conditions. The protective layer is consisted of an organic material layer formed on the structural components of the device, an inorganic material layer formed on the organic material layer, and a coating layer formed on the inorganic material layer. The coating layer formed on the inorganic material layer is made from titanium aluminum nitride (TiN).

1 Claim, 1 Drawing Sheet

U.S. PATENT DOCUMENTS

| | | |
|---|---|---|
| 2003/0117066 A1 | 6/2003 | Silvernail |
| 2003/0117068 A1* | 6/2003 | Forrest et al. .................. 313/504 |
| 2003/0124392 A1* | 7/2003 | Bright ........................... 428/698 |
| 2003/0184892 A1 | 10/2003 | Lu et al. |
| 2003/0189403 A1* | 10/2003 | Yamada et al. ............... 313/511 |
| 2003/0203210 A1* | 10/2003 | Graff et al. ................... 428/412 |
| 2005/0012133 A1* | 1/2005 | Mikawa et al. ............... 257/310 |
| 2005/0098113 A1 | 5/2005 | Hayashi |
| 2005/0140578 A1 | 6/2005 | Yamazaki et al. |

FOREIGN PATENT DOCUMENTS

| | | |
|---|---|---|
| JP | 7-176384 A | 7/1995 |
| JP | 10-275680 A | 10/1998 |
| JP | 10-312883 A | 11/1998 |
| JP | 2001203075 A | 7/2001 |
| JP | 2002117973 A | 4/2002 |
| JP | 2002324667 A | 11/2002 |
| JP | 2003045652 A | 2/2003 |
| JP | 2003-142255 A | 6/2003 |
| JP | 2003-297571 A | 10/2003 |
| JP | 2003-323974 A | 11/2003 |
| KR | 2003-0036089 | 5/2003 |

OTHER PUBLICATIONS

Man, B.Y. "Microstructure Oxidation and H2-permeation Resistance of TiA1N films deposited by DC Magnetron Sputtering Technique" Surface Coatings Technology 180-181 (2004) pp. 9-14.

* cited by examiner

ORGANIC ELECTROLUMINESCENT DEVICE WITHOUT CAP AND GETTER

BACKGROUND OF THE INVENTION

1. Field of the Invention

The present invention relates to an organic electroluminescent device, particularly to an organic electroluminescent device which can completely separate its components from external conditions without using a cap and clearly reduce its thickness without installing a getter.

2. Description of the Prior Art

Organic electroluminescence is the phenomenon that excitons are formed in an (low molecular or high molecular) organic material thin film by re-combining holes injected through an anode with electrons injected through a cathode, and light of specific wavelength is generated by energy from thus formed excitons.

Organic electroluminescent device using the above phenomenon has a basic structure as illustrated in FIG. 1. The basic structure of organic electroluminescent device includes a glass substrate 1, an indium-tin-oxide layer 2 (hereinafter, referred as "ITO layer") acting as anode electrode, formed on the upper side of the glass substrate 1, and an insulating layer, an organic material layer 3, and a metal layer 4 acting as cathode electrode in order.

For reference, the organic material layer 3 has the structure that a hole injection layer for injecting holes into the device; a hole transport layer for transporting the holes injected from the anode electrode to a light emitting layer; the light emitting layer which electron supplied from the cathode electrode and holes supplied from the anode electrode are recombined and light is emitted therefrom; and an electron transport layer for transporting electron supplied from the cathode electrode are stacked in order.

The organic electroluminescent device having the above structure is manufactured through the following processes. First, the ITO layer 2 is deposited on the glass substrate 1 through the vacuum deposition method, and the ITO layer 2 is patterned by the photolithography method.

Then, an insulating layer (not shown), the organic material layer 3, and walls W are formed on the patterned ITO layer 2. The organic material layer 3 is formed on the insulating layer, and the metal layer 4 acting as the cathode is formed on the organic material layer 3. Here, each wall W is formed to separately deposit the metal layers 4 on the ITO layer 2.

After each component is formed as described above, a cap 6 is bonded on a periphery portion of the substrate 1 by a sealant 5. As shown in FIG. 1, a closed space is formed between the cap 6 and the substrate 1, and so the above components disposed in this space are not influenced by external conditions such as moisture and the like.

Here, organic material constituting the device is vulnerable to moisture and heat, and thus the cap 6 used for protecting the components from external conditions is made from metal, glass, or synthetic material thereof. Also, an ultraviolet ray-curable adhesive is used as the sealant 5.

On the other hand, a getter 8 which is moisture absorbent is attached to a lower surface of the central portion of the cap 6 by a tape 7 made from organic material. Moisture (humidity) remains in the space between the cap 6 and the substrate 1 at which the structural components constituting the device are disposed. Therefore, in order to absorb the moisture, the getter 8 is attached to a lower surface of the cap 6, and then the cap 6 is bonded to the substrate 1.

The getter 8 used for the above-explained purpose is made from, for example, calcium oxide (CaO), barium oxide (BaO), etc., and can be applied in the form of film, paste, or powder.

The organic electroluminescent device shown in FIG. 1 needs a space for the getter 8. Also, the metal layer 4 is oxidized in case the getter 8 and the metal layer 4 are contacted with each other, and so a certain space is needed between the metal layer 4 and the getter 8. This structure acts as a factor increasing thickness of the device. Thus, it is desirable to eliminate the factor increasing thickness of the device in order to conform to the trend of miniaturization of the device itself and apparatus that the device is mounted to.

SUMMARY OF THE INVENTION

An object of the present invention is to solve the above mentioned problems caused by the getter used for absorbing moisture in the organic electroluminescent device and the cap used for excluding the structural components from external conditions, and to provide the organic electroluminescent device whose structural components can be excluded completely from external conditions without using the cap.

Another object of the present invention is to provide the organic electroluminescent device whose thickness can be remarkably reduced without installing the getter.

The organic electroluminescent device according to the present invention has the structure that a protective film of multi-layered structure is formed on the entire structure of the structural components to completely exclude the structural components from external conditions.

The protective film in the present invention is consisted of an organic material layer formed on the structural components of the device, an inorganic material layer formed on the organic material layer, and a coating layer formed on the inorganic material layer.

The coating layer is made from titanium aluminum nitride which is a kind of oxide, and the coating layer is formed on the entire structure enough to completely exclude inorganic material layer, the organic material layer, and the structural components of the device from external conditions.

BRIEF DESCRIPTION OF THE DRAWINGS

The present invention will be more clearly understood from the detailed description in conjunction with the following drawings.

DETAILED DESCRIPTION OF THE INVENTION

Hereinafter, the embodiments of the present invention will be described in detail with reference to those accompanying drawings.

Figure 1:
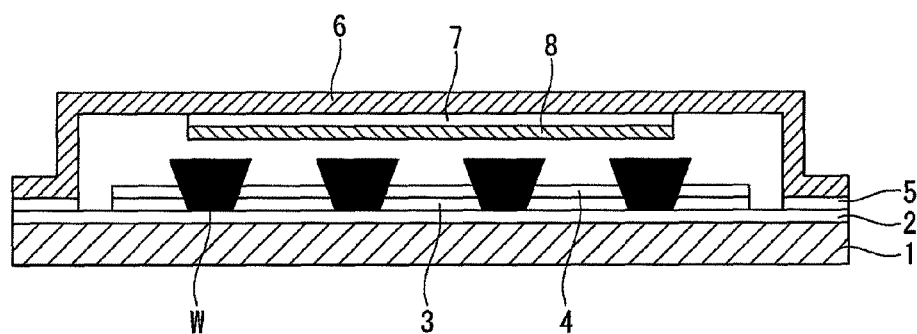
FIG. 1 is a sectional view showing schematically the basic structure of an organic electroluminescent device.
Figure 2:
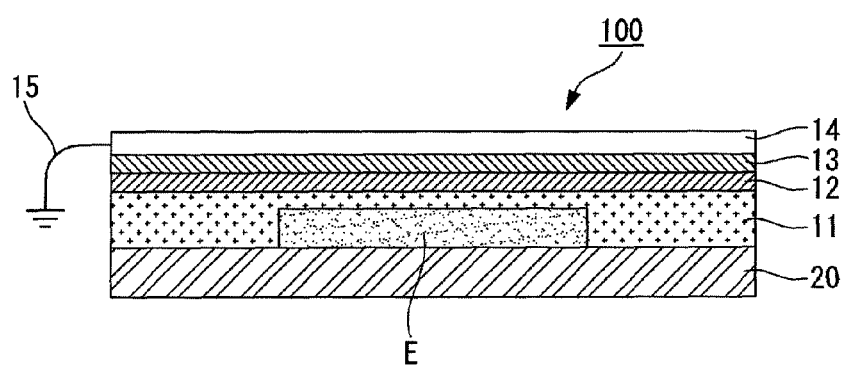
FIG. 2 is a sectional view showing the structure of the organic electroluminescent device according to the present invention.

FIG. 2 is a sectional view showing the structure of the organic electroluminescent device according to the present invention. FIG. 2 did not individually mark each of an ITO layer formed on a glass substrate 20 and acting as the anode, an insulating layer, and an organic material layer, and a metal layer acting as cathode electrode, constituting the organic electroluminescent device 100, since they are the same as the structural components shown in FIG. 1. For convenience, these structural components are shown as a single block and designated as the reference numeral "E."

A major feature of the organic electroluminescent device 100 according to the present invention is to form a passivation film, a protective layer, on the substrate 20 including the structural components E. The protective layer has the structure that the structural components E formed on the substrate 20 can be completely excluded from external conditions, and so external moisture (humidity) cannot penetrate the structural components E.

The protective layer is consisted of an organic material layer 11 contacting with the structural components E, an inorganic material layer 12 formed on the organic material layer 11, and a coating layer 13 formed on the inorganic material layer 12.

The organic material layer 11 formed on the structural components E and contacting with the metal layer (4 in FIG. 1) is formed through the deposition process and made from the material with low conductivity. The organic material layer 11 made from such material is easily planarized at a process temperature. Thus, when the process for forming the protective layer is performed, the organic material layer 11 is planarized on the structural components E, and so the inorganic material layer 12 and the coating layer 13 are also planarized. Ultimately, the device 100 can have the planarized shape as shown in FIG. 2.

The inorganic material layer 12 is formed on the organic material layer 11 and made from silicon dioxide ($SiO_2$) or silicon nitride ($SiN_x$). Silicon dioxide ($SiO_2$) and silicon nitride ($SiN_x$) used for forming the inorganic material layer 12 have high density so that external moisture and oxygen cannot penetrate the inorganic material layer 12. Accordingly, the structure components E of the device 100 are excluded from external conditions (moisture and oxygen).

The coating layer 13 formed on the inorganic material layer 12 is made from titanium aluminum nitride (TiAlN) which is a kind of oxide, and formed through the sputtering method or the e-beam evaporating method. By forming the coating layer 13 on the entire structure, the inorganic material layer 12, the organic material layer 11, and the structural components E are completely excluded from external conditions.

In general, the metal layer (4 in FIG. 1) which is one of the major structural components E of the device 100 is made from calcium or aluminum, reacting well with oxygen, which is well known in the art. Accordingly, the coating layer 13 completely exclude the structural components E from external conditions, and so the coating layer 13 can prevent oxygen and hydrogen from penetrating the structural components E of the device 100. Consequently, the metal layer can be effectively prevented from contacting and reacting with moisture and oxygen.

In the present invention, the coating layer 13 can be formed as a double layered structure consisted of titanium nitride layer and aluminum nitride layer, or a multi-layered structure of more than two layers. Also, the coating layer 13 can be formed as a double layered structure consisted of titanium nitride layer and aluminum layer, or a multi-layered structure of more than two layers.

In the process for manufacturing the semiconductor device, titanium nitride (TiN) layer is a typical thin layer used as an oxygen diffusion prevention film. Accordingly, the oxygen diffusion in the device is precluded by the titanium nitride layer consisting of the coating layer 13.

Also, aluminum is well known as a material which has high reactivity with moisture ($H_2O$). Therefore, if aluminum layer or aluminum nitride layer is formed as one layer of the coating layer 13, aluminum reacts with oxygen to form aluminum oxide, and so external oxygen or moisture cannot penetrate the device.

On the other hand, electric power is applied to the device 100 for operating the device, wherein static electricity may be generated on the structural components E made from conductive materials by electric power. Thus generated static electricity may be charged to the structural components E to affect the function of the device 100, and in a worse case, even to damage the device 100 itself.

In order to prevent these problems, in the device according to the present invention, an electrode 14 is formed on the coating layer 13, and a wire 15 connected to the electrode is grounded. Accordingly, the static electricity generated in the device is discharged to the outside through the organic material layer 11, the inorganic material layer 12, and the coating layer 13. That is, the static electricity is not charged in the device 100 itself. In particular, titanium aluminum nitride constituting the coating layer 13 has a low resistance value, and so outward discharge of the static electricity can be easily achieved.

Here, the deposition process and the sputtering process (or the e-beam evaporating process) for forming the organic material layer 11 and the coating layer 13 as protective layer 10 are general processes in this art, and so the detailed description thereon is omitted.

The organic electroluminescent device according to the present invention has the organic material layer, the inorganic material layer, and the coating layer as the protective film on the structural components constituting the device stacked in order, and so external moisture and oxygen cannot penetrate the device. Consequently, there is no need to mount the getter which is an indispensable structural component for removing moisture.

Due to this structure, compared with the conventional device shown in FIG. 1, the total height of the present device with which the getter is not installed is remarkably reduced. Thus, the present invention can be greatly helpful for miniaturization of the device and the apparatus to which the device is mounted, and various problems caused by using the getter (for example, restriction in selection of getter material) can be solved.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An organic electroluminescent device comprising:
    a glass substrate;
    an electroluminescence element formed on a portion of the glass substrate;
    an organic material layer formed on the substrate to enclose the electroluminescence element;
    an inorganic material layer formed on the organic material layer;
    a coating layer directly formed on the inorganic material layer;
    an electrode directly formed on the coating layer; and
    a wire connected to the electrode and being grounded to discharge static electricity generated in the electroluminescence element through the organic material layer, the inorganic material layer and coating the layer,
    wherein the coating layer has a stack structure including titanium nitride layer and an aluminum nitride layer which are directly contacted with each other in order to completely separate the electroluminescence from environmental conditions.

* * * * *